United States Patent
Hussein et al.

(10) Patent No.: US 8,810,984 B2
(45) Date of Patent: Aug. 19, 2014

(54) GATE CIRCUIT

(75) Inventors: Khalid Hassan Hussein, Tokyo (JP);
Akira Yamamoto, Fukuoka (JP); Fumio Wada, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 284 days.

(21) Appl. No.: 13/313,466

(22) Filed: Dec. 7, 2011

(65) Prior Publication Data

US 2012/0229942 A1    Sep. 13, 2012

(30) Foreign Application Priority Data

Mar. 9, 2011 (JP) ................................. 2011-051502

(51) Int. Cl.
*H02H 9/02* (2006.01)

(52) U.S. Cl.
USPC ........................................................ 361/93.1

(58) Field of Classification Search
USPC ................................................. 361/18, 93.1
See application file for complete search history.

(56) References Cited

U.S. PATENT DOCUMENTS

| | | | | |
|---|---|---|---|---|
| 6,717,785 B2 * | 4/2004 | Fukuda et al. | ............... | 361/93.1 |
| 6,891,707 B2 * | 5/2005 | Hiyama et al. | ............... | 361/93.1 |
| 7,378,805 B2 * | 5/2008 | Oh et al. | ............... | 315/291 |

FOREIGN PATENT DOCUMENTS

| | | | |
|---|---|---|---|
| CN | 101199239 A | | 6/2008 |
| JP | 3-40517 A | | 2/1991 |
| JP | 8-321756 | | 12/1996 |
| JP | 10-108477 A | | 4/1998 |
| JP | 10108477 A | * | 4/1998 |
| JP | 2002-353795 | | 12/2002 |
| JP | 2005-51960 | | 2/2005 |
| JP | 2006-222593 | | 8/2006 |
| JP | 2007-259533 | | 10/2007 |
| JP | 2007-312504 | | 11/2007 |
| JP | 2009-95166 | | 4/2009 |

OTHER PUBLICATIONS

Yamagiwa, Takashi, Inverter circuit (Machine Translation of JP 10108477 A), Apr. 1998.*
Combined Chinese Office Action and Search Report issued Jan. 6, 2014 in Patent Application No. 201210069156.6 (with English language translation).
Office Action issued on Jan. 14, 2014 in the corresponding Japanese Patent Application No. 2011-051502 (with Partial English Translation).

* cited by examiner

*Primary Examiner* — Jared Fureman
*Assistant Examiner* — Kevin J Comber
(74) *Attorney, Agent, or Firm* — Oblon, Spivak, McClelland, Maier & Neustadt, L.L.P.

(57) ABSTRACT

A gate circuit includes a gate resistive element connected at one end to the gate of a power device, an on-switching device connected between a power supply and the other end of the gate resistive element, a first resistive element whose connection to the gate is controlled by a first switching device, a second resistive element whose connection to the gate is controlled by a second switching device, and having a higher resistance value than the first resistive element, excessive current suppression means for turning on the first switching device just when the current in the power device reaches a predetermined value, and turn-off delay means for, after the excessive current suppression means turns on the first switching device, turning off the on-switching device and the first switching device and turning on the second switching device to turn off the power device.

10 Claims, 8 Drawing Sheets

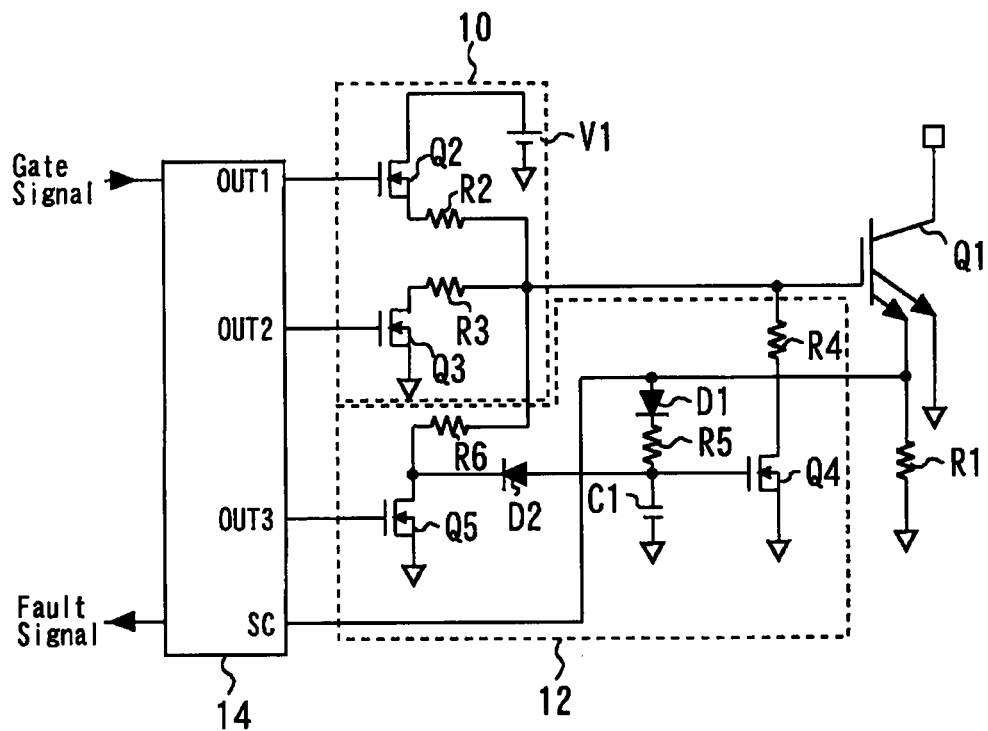
F I G. 1
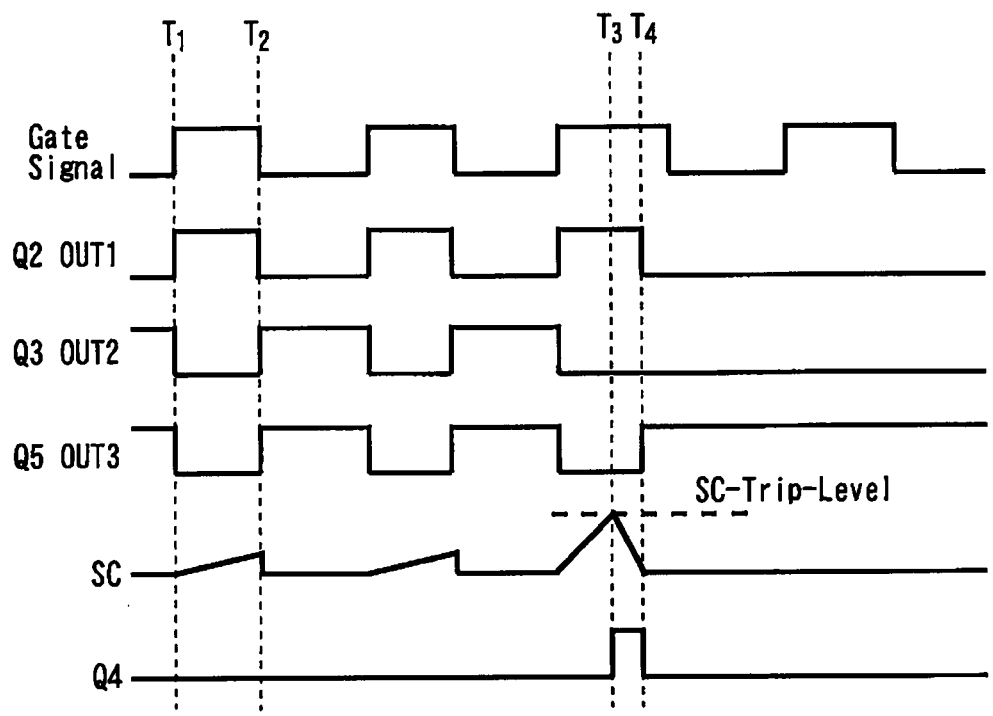
F I G. 2

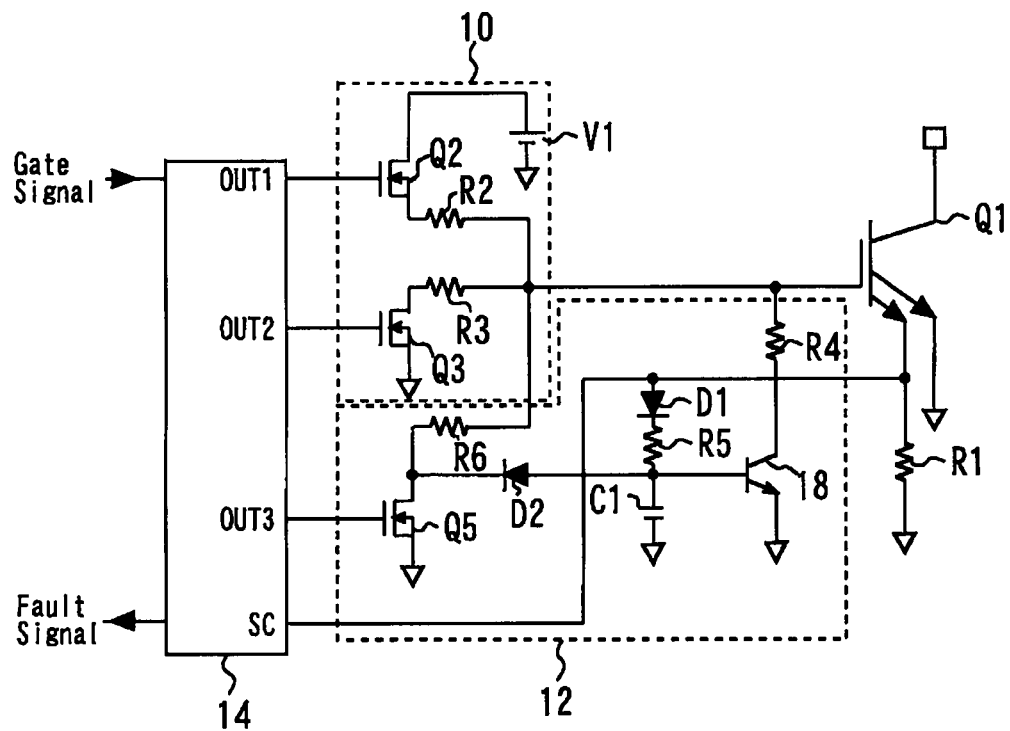
F I G. 5
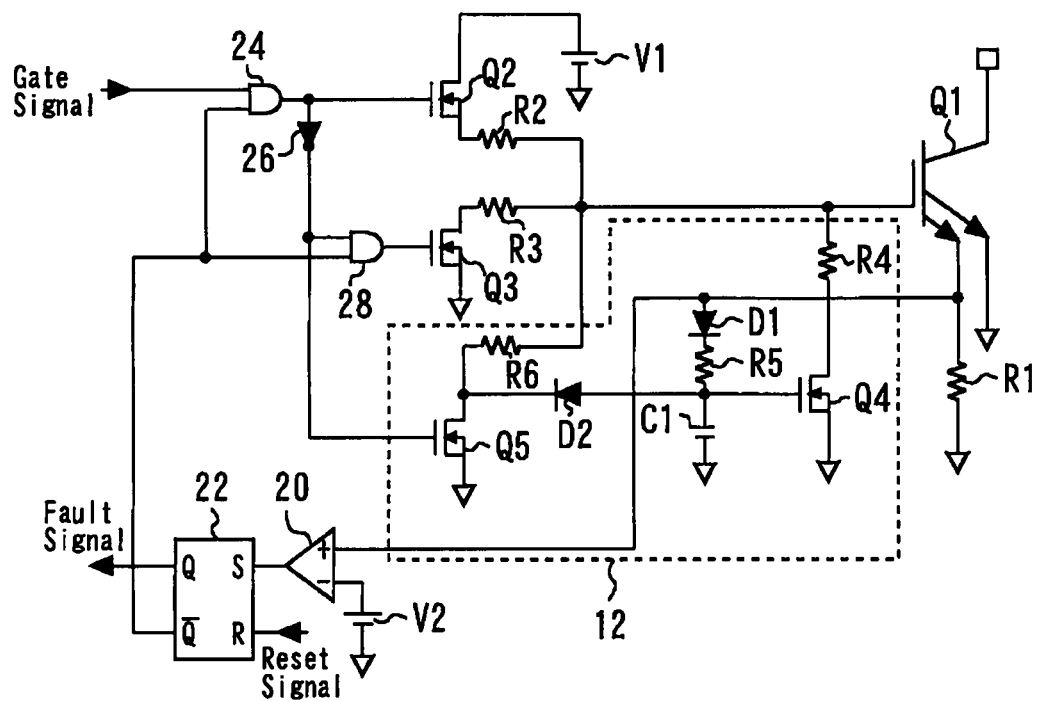
F I G. 6

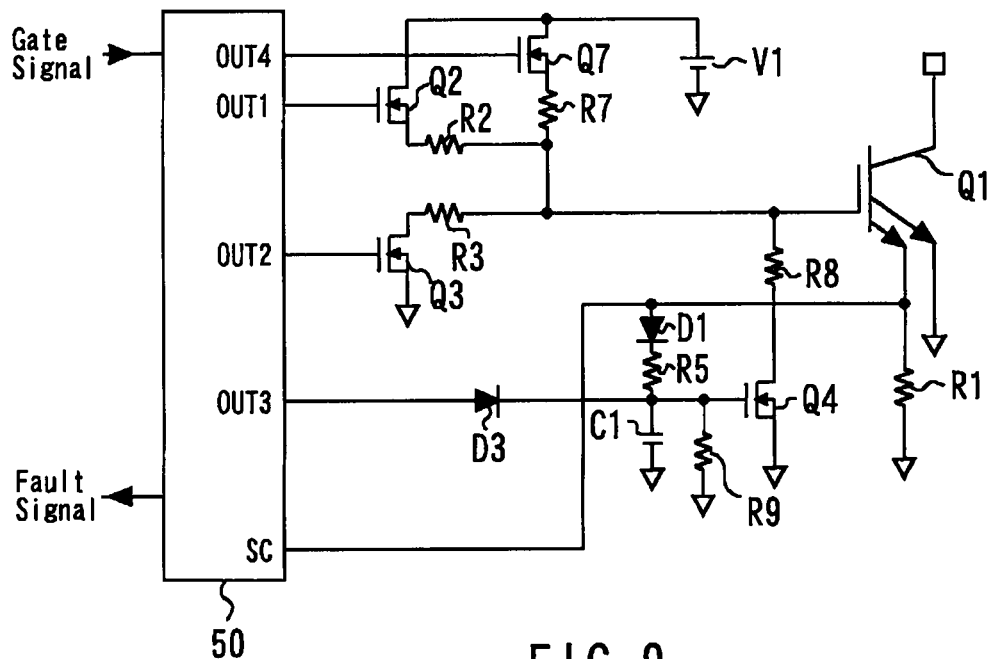
F I G. 9
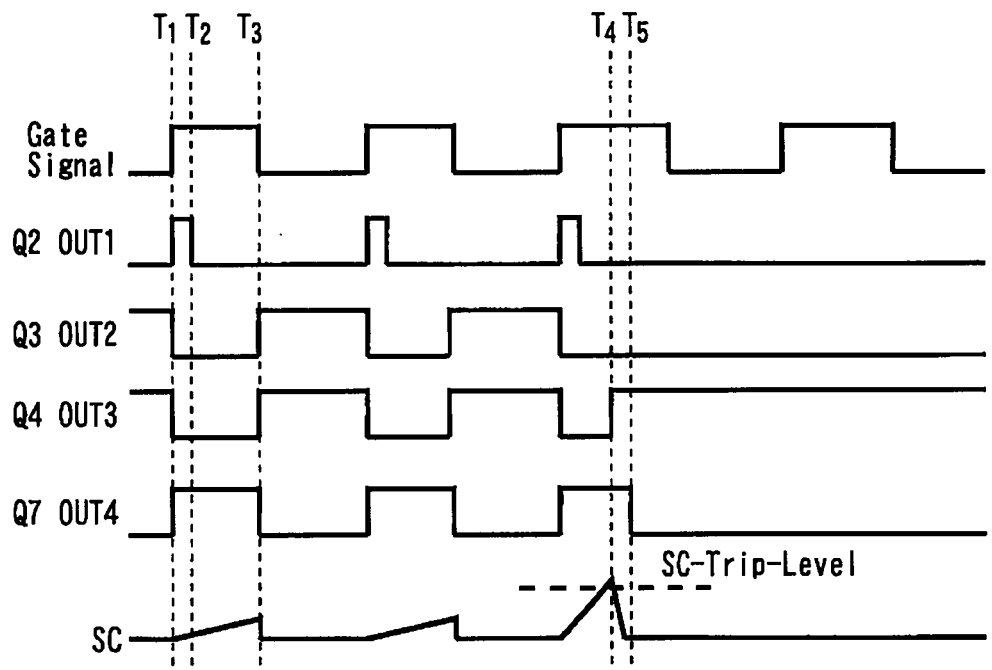
F I G. 10

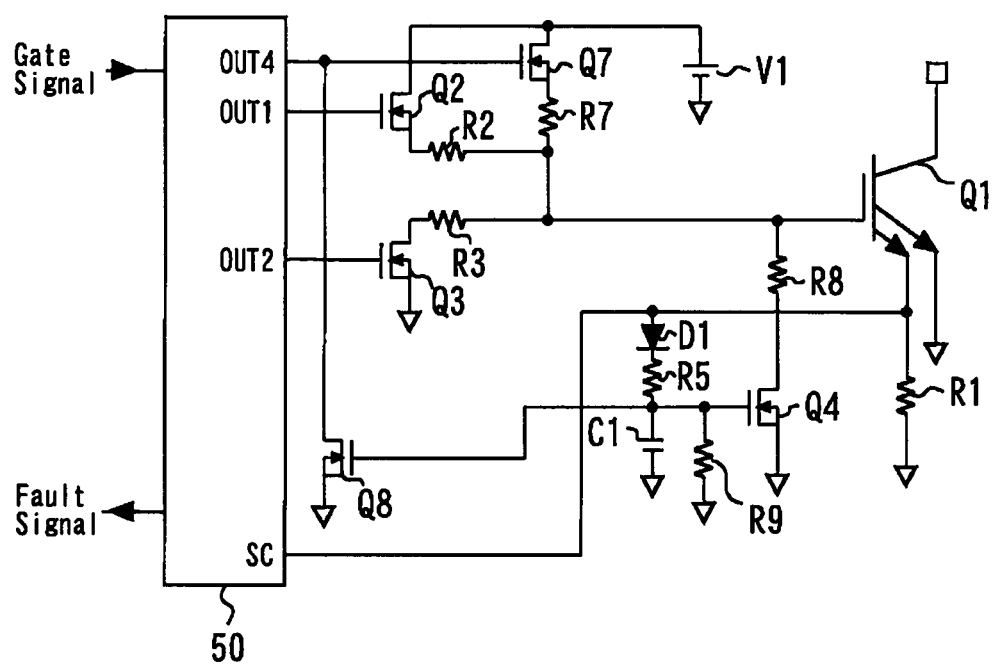
F I G. 15

GATE CIRCUIT

BACKGROUND OF THE INVENTION

1. Field of the Invention

The present invention relates to a gate circuit connected to the gate of a power device.

2. Background Art

Japanese Laid-Open Patent Publication No. 2002-353795 discloses a gate circuit connected to the gate of a power device. When an excessive current flows through the power device, this gate circuit functions so that part of the gate supply voltage appears across a resistive element. This serves to reduce the voltage actually applied to the gate of the power device, thereby reducing the excessive current in the device.

In order to quickly reduce the excessive current in the power device, it is desirable to reduce the resistance value of the above resistive element. It should be noted that the power device is turned off after reducing the excessive current. In the gate circuit disclosed in the above patent publication, however, the power device is turned off by use of a resistive element of a relatively low resistance value connected to its gate. This results in a rapid rate of decrease in the current (di/dt) in the power device, which has been found to cause a surge voltage in some cases.

SUMMARY OF THE INVENTION

The present invention has been made to solve the above problems. It is, therefore, an object of the present invention to provide a gate circuit capable of quickly reducing an excessive current flowing in a power device and yet capable of turning off the power device while maintaining a slow rate of decrease in the current (di/dt) in the device.

According to one aspect of the present invention, a gate circuit includes a gate resistive element connected at one end to the gate of a power device, an on-switching device connected between a power supply and the other end of the gate resistive element, a first resistive element connected at one end to the gate, a first switching device connected at one end to the other end of the first resistive element and at the other end to ground, a second resistive element connected at one end to the gate and having a higher resistance value than the first resistive element, a second switching device connected at one end to the other end of the second resistive element and at the other end to ground, excessive current suppression means for turning on the first switching device just when the current in the power device reaches a predetermined value, and turn-off delay means for, after the excessive current suppression means turns on the first switching device, turning off the on-switching device and the first switching device and turning on the second switching device to turn off the power device.

According to another aspect of the present invention, a gate circuit includes the parallel connection of a first gate resistive element and a second gate resistive element connected between a power supply and the gate of a power device, the second gate resistive element having a higher resistance value than the first gate resistive element, a first on-switching device for permitting and preventing the application of a voltage through the first gate resistive element to the gate, a second on-switching device for permitting and preventing the application of a voltage through the second gate resistive element to the gate, a resistive element connected at one end to the gate, a switching device connected at one end to the other end of the resistive element and at the other end to ground, means for turning on the first on-switching device and the second on-switching device to turn on the power device, means for, when the power device is maintained in a steady on state, turning off the first on-switching device and maintaining the second on-switching device in an on state, excessive current suppression means for turning on the switching device just when the current in the power device reaches a predetermined value, and turn-off delay means for, after the excessive current suppression means turns on the switching device, turning off the second on-switching device and maintaining the switching device in an on state to turn off the power device.

Other and further objects, features and advantages of the invention will appear more fully from the following description.

BRIEF DESCRIPTION OF THE DRAWINGS

FIG. 1 is a circuit diagram of a gate circuit in accordance with a first embodiment of the present invention;

FIG. 2 is a timing chart showing the signal level at each terminal, etc. of the controller integrated circuit of the first embodiment;

FIG. 5 is a circuit diagram of a gate circuit in which the first switching device is a bipolar transistor;

FIG. 6 is a circuit diagram of a gate circuit in accordance with a second embodiment of the present invention;

FIG. 9 is a circuit diagram of a gate circuit in accordance with a third embodiment of the present invention;

FIG. 10 is a timing chart showing the signal level at each terminal, etc. of the controller integrated circuit of the third embodiment;

FIG. 15 is a circuit diagram of a variation of the gate circuit of the fifth embodiment.

DETAILED DESCRIPTION OF THE PREFERRED EMBODIMENTS

First Embodiment

Figure 3:
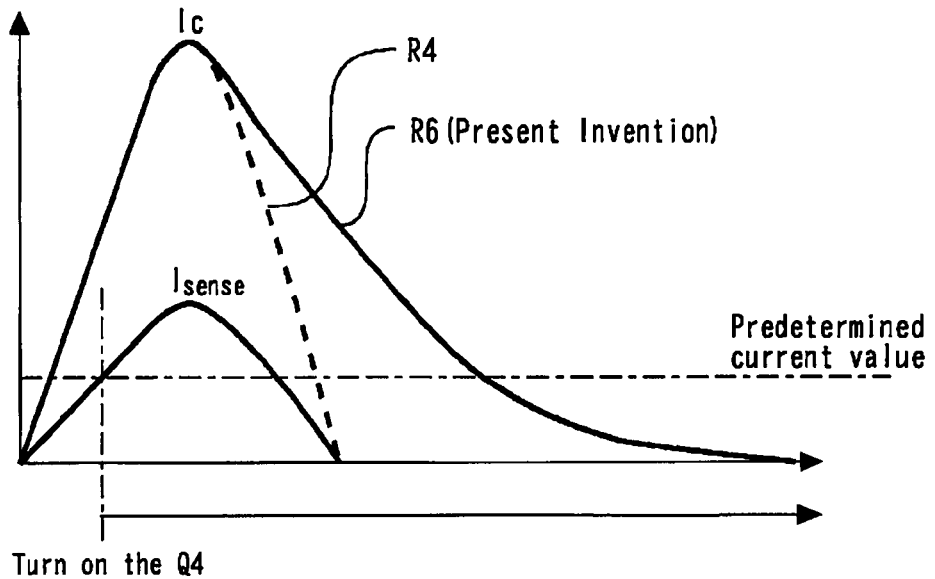
FIG. 3 is a diagram showing the collector current and the emitter sense current (indicated by solid lines) of the power device when it is connected to the gate circuit of the first embodiment.

FIG. 1 is a circuit diagram of a gate circuit in accordance with a first embodiment of the present invention. The gate circuit includes a normal operation circuit 10, a protection circuit 12, and a controller integrated circuit 14. The gate circuit controls the voltage applied to the gate of a power device Q1. It should be noted that the power device Q1 is provided with an emitter sense terminal. A current detection shunt resistance R1 is connected to the emitter sense terminal. The normal operation circuit 10, the protection circuit 12, and the controller integrated circuit 14 will be described in detail.

The normal operation circuit 10 includes a gate resistive element R2 connected to the gate. An on-switching device Q2 is connected to the gate resistive element R2. The on-switching device Q2 is connected between a power supply V1 and the gate resistive element R2. That is, this on-switching device Q2 is used to permit and prevent the application of a voltage through the gate resistive element R2 to the gate of the power device Q1. The gate resistive element R2 has a resistance value low enough that the loss in the element is small when the power device Q1 is turned on.

The normal operation circuit 10 also includes a gate resistive element R3 connected to the gate of the power device Q1. An off-switching device Q3 is connected to the gate resistive element R3. The off-switching device Q3 and the gate resistive element R3 are used to turn off the power device Q1.

The protection circuit 12 includes a first resistive element R4 connected at one end to the gate of the power device Q1. The resistance value of the first resistive element R4 is equal to that of the gate resistive element R2. One end of a first switching device Q4 is connected to the other end of the first resistive element R4. The other end of the first switching device Q4 is connected to ground. In this specification, one end of a switching device refers to either the source or the drain of the device, and the other end of the switching device refers to the other of the source and the drain of the device.

The protection circuit 12 also includes a diode D1 connected at its anode to the emitter sense terminal of the power device Q1. The cathode of the diode D1 is connected to one end of a resistive element R5. The other end of the resistive element R5 is connected to one end of a capacitor C1. The one end of the capacitor C1 is also connected to the gate of the first switching device Q4. The other end of the capacitor C1 is connected to ground. The capacitor C1 is such that the first switching device Q4 is turned on by the charged voltage on the capacitor C1 just when the current in the power device Q1 reaches a predetermined value. That is, the capacitor C1 functions as an excessive current suppression means to turn on the first switching device Q4 when the current in the power device Q1 reaches the predetermined value.

The protection circuit 12 further includes a second resistive element R6 connected at one end to the gate of the power device Q1 and having a higher resistance value than the first resistive element R4. The other end of the second resistive element R6 is connected to one end of a second switching device Q5. The other end of the second switching device Q5 is connected to ground. Further, the cathode of a diode D2 is connected to the one end of the second switching device Q5. The anode of the diode D2 is connected to the one end of the capacitor C1 and hence to the gate of the first switching device Q4. The diode D2 is used to discharge the charge accumulated on the capacitor C1.

The controller integrated circuit 14 has a first terminal OUT1 for outputting a signal to control turning on and off of the on-switching device Q2. The controller integrated circuit 14 also has a second terminal OUT2 and a third terminal OUT3 for turning on and off the off-switching device Q3 and the second switching device Q5, respectively. Further, the controller integrated circuit 14 also has an SC terminal for detecting the emitter sense current of the power device Q1. It should be noted that in FIG. 1, "Gate Signal" indicates a gate drive signal externally supplied to the controller integrated circuit 14. Further, "Fault Signal" indicates an error signal output from the controller integrated circuit 14 when an excessive current has been detected.

The operation of the gate circuit of the first embodiment will now be described. FIG. 2 is a timing chart showing the signal level at each terminal, etc. of the controller integrated circuit 14 of the first embodiment. First, the normal operation of the gate circuit will be described with reference to the period from time T1 until time T2 in FIG. 2. In FIG. 2, T1 indicates a time at which the power device Q1 is turned on, and T2 indicates a time at which the power device Q1 is turned off. Specifically, when the power device Q1 is to be turned on at T1, a signal for turning on the on-switching device Q2 is supplied from the first terminal OUT1 of the controller integrated circuit 14 to the gate of the on-switching device Q2. This signal turns on the on-switching device Q2, and as a result a voltage is applied from the power supply V1 through the gate resistive element R2 to the gate of the power device Q1. When the power device Q1 is to be turned off at time T2, on the other hand, a signal is supplied from the second terminal OUT2 to the gate of the off-switching device Q3 to turn on the off-switching device Q3 so that the gate resistive element R3 is electrically connected between the gate of the power device Q1 and ground.

The operation of the gate circuit when the current in the power device Q1 has reached a predetermined value will now be described with reference to the period from time T3 until time T4 in FIG. 2. When the power device Q1 is in its on state, it may happen that an excessive current flows through the power device Q1 due to arm short-circuit, etc. When an excessive current flows in the power device Q1, the emitter sense current from the power device Q1 increases, thereby charging the capacitor C1. When the current in the power device Q1 reaches a predetermined value, the first switching device Q4 is turned on by the charged voltage on the capacitor C1. As a result, part of the gate supply voltage from the power supply V1 appears across the first resistive element R4 (that is, the gate supply voltage is applied across the series connection of the gate resistive element R2 and the first resistive element R4), resulting in a reduced voltage being applied to the gate of the power device Q1. Since the resistance value of the first resistive element R4 is equal to that of the gate resistive element R2, the voltage across the first resistive element R4 is half the gate supply voltage. It should be noted that when the power device Q1 is in its on state, its gate voltage is normally substantially equal to the gate supply voltage from power supply V1.

At time T4, some time after the first switching device Q4 is turned on, the controller integrated circuit 14 detects the excessive current flowing through the power device Q1 by sensing the voltage on the SC terminal and functions to reduce the current. Specifically, the controller integrated circuit 14 cuts off the signal supply to the first terminal OUT1 to turn off the on-switching device Q2, and outputs a signal through the third terminal OUT3 to turn on the second switching device Q5. Since the gate of the first switching device Q4 is connected to the drain of the second switching device Q5 through the diode D2, the turning on of the second switching device Q5 results in turning off the first switching device Q4. As a result, at time T4, the on-switching device Q2 and the first switching device Q4 are turned off and the second switching device Q5 is turned on. This means that after time T4 the power device Q1 is gradually turned off since its gate is connected to ground through the second resistive element R6 which has a higher resistance value than the first resistive element R4. Thus, the controller integrated circuit 14 functions as a turn-off delay means for gradually turning off the power device Q1 by use of the second resistive element R6 having a high resistance value.

It should be noted that the period between time T3 and time T4 is typically approximately a few nanoseconds. That is, after the current in the power device Q1 reaches a predetermined value at time T3, it takes a few nanoseconds for the controller integrated circuit 14 to initiate internal processing and produce a response.

Thus the gate circuit of the first embodiment turns on the first switching device Q4 just when the current in the power device Q1 reaches a predetermined value. As a result, part of the gate supply voltage from the power supply V1 appears across the first resistive element R4 (that is, the gate supply voltage is applied across the series connection of the gate resistive element R2 and the first resistive element R4), resulting in rapid reduction of the excessive current in the power device Q1. Further, after the excessive current in the power device Q1 is thus reduced, the power device Q1 is gradually turned off by the above described turn-off delay means, which uses the second resistive element R6 having a greater resistance value than the first resistive element R4. Thus the second resistive element R6 is used only for gradually turning off the power device Q1 after reducing the excessive current in the power device Q1 to a certain level. Therefore, the resistance value of the second resistive element R6 can be independently selected to be high, making it possible to turn off the power device Q1 while maintaining a slow rate of decrease in the current (di/dt) in the device and thereby suppressing surge voltages.

FIG. 3 is a diagram showing the collector current and the emitter sense current (indicated by solid lines) of the power device Q1 when it is connected to the gate circuit of the first embodiment. When the current in the power device Q1 reaches a predetermined value, the emitter sense current ($I_{SENSE}$) reaches a corresponding value, which is detected by the gate circuit. Upon this detection, the gate circuit turns on the first switching device Q4, resulting in rapid reduction of the excessive current in the power device. Subsequently, the second switching device Q5 is turned on and the first switching device Q4 is turned off so that the power device Q1 is gradually turned off (i.e., the operation of the power device Q1 is softly shut down) by use of the second resistive element R6 having a high resistance value. It should be noted that the dashed line in FIG. 3 indicates the collector current of the power device Q1 when the device is turned off by use of the first resistive element R4 having a lower resistance value than the second resistive element R6.

Figure 4:
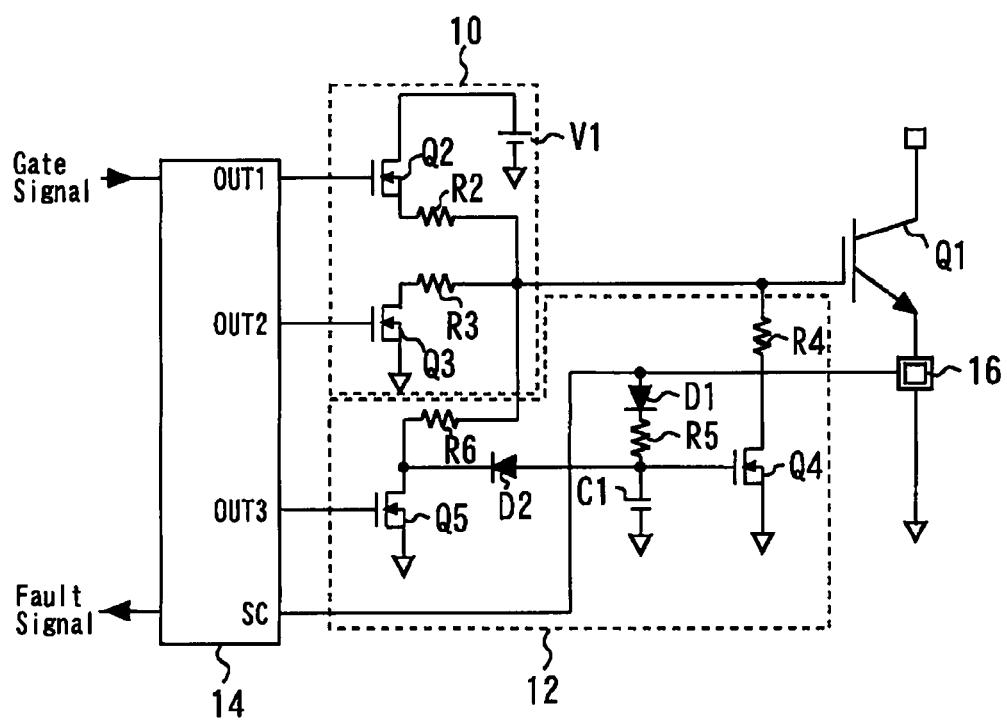
FIG. 4 is a circuit diagram of a gate circuit provided with a current transformer for detecting an excessive current in the power device.

Although in the first embodiment the means for detecting an excessive current in the power device senses the emitter sense current, it is to be understood that the present invention is not limited to this particular excessive current detecting means. For example, it is possible to use a current sensor, such as a current transformer, externally connected to the power device. FIG. 4 is a circuit diagram of a gate circuit provided with a current transformer 16 for detecting an excessive current in the power device. Thus, the use of an external current sensor connected to the power device eliminates the need for an on-chip current sensor on the device. It should be noted that in FIG. 4 components corresponding to those shown in FIG. 1 are denoted by the same reference numerals. Further, in the following circuit diagrams, corresponding components are also denoted by the same reference numerals.

Although in the first embodiment the first switching device Q4 is a MOS transistor, it is to be understood that the present invention is not limited to this particular type of transistor. The first switching device Q4 may be a bipolar transistor. FIG. 5 is a circuit diagram of a gate circuit in which the first switching device is a bipolar transistor 18.

Although in the first embodiment the resistance value of the first resistive element R4 is equal to that of the gate resistive element R2, it is to be understood that the present invention is not limited to this particular embodiment. The present invention only requires that the resistance value of the first resistive element R4 is small enough that the voltage across the first resistive element R4, i.e., the gate voltage of the power device, is relatively low when the first switching device Q4 is turned on after the current in the power device reaches a predetermined value. It should be noted that when the first switching device Q4 is turned on, the voltage across the first resistive element R4, i.e., the gate voltage of the power device, is represented by the following expression: $R4*V1/(R4+R2)$, where V1 is the gate supply voltage, R4 is the resistance value of the first resistive element, and R2 is the resistance value of the gate resistive element.

Second Embodiment

FIG. 6 is a circuit diagram of a gate circuit in accordance with a second embodiment of the present invention. The following description of this gate circuit will be primarily directed to the differences from the gate circuit of the first embodiment. The turn-off delay means of the gate circuit of the second embodiment is formed by discrete components. That is, this gate circuit differs from that of the first embodiment in that the controller integrated circuit is replaced by discrete components.

The gate circuit of the second embodiment includes a differential amplifier 20. The differential amplifier 20 amplifies the difference between the emitter sense voltage of the power device Q1 and the output voltage of a power supply V2. The output of the differential amplifier 20 is input to a flip-flop circuit 22. An output of the flip-flop circuit 22 is input to one input of an AND gate 24. The other input of the AND gate 24 receives the gate drive signal (Gate Signal). The output of the AND gate 24 is used for the on-off control of the on-switching device Q2. The output of the AND gate 24 is input to one input of an AND gate 28 through a NOT gate 26. The other input of the AND gate 28 receives an output of the flip-flop circuit 22. The output of the AND gate 28 is used for the on-off control of the off-switching device Q3. The second switching device Q5 is controlled by the output of the NOT gate.

Signal levels in this gate circuit, which uses discrete components, can also be represented by the timing chart of FIG. 2. However, since this gate circuit controls the switching devices by use of discrete components instead of a control integrated circuit, there is no delay associated with the internal processing of the control integrated circuit, resulting in an increase in the speed of response of the gate circuit. Specifically, in this gate circuit, the period between time T3 and time T4 shown in FIG. 2 is shorter than in the gate circuit of the first embodiment.

Figure 7:
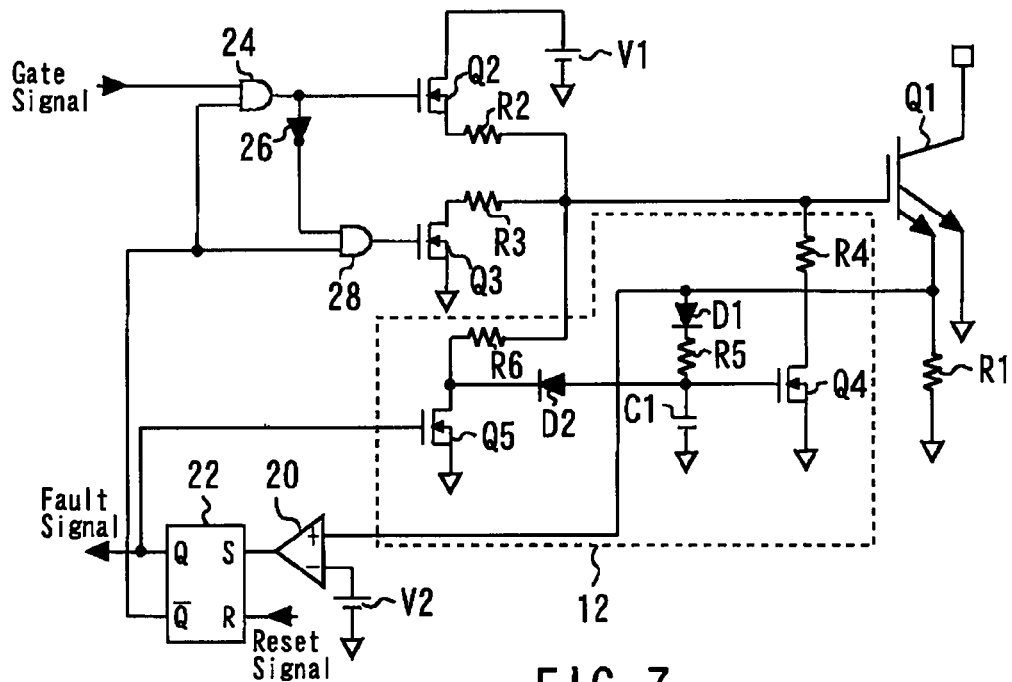
FIG. 7 is a circuit diagram of a variation of the gate circuit of the second embodiment.
Figure 8:
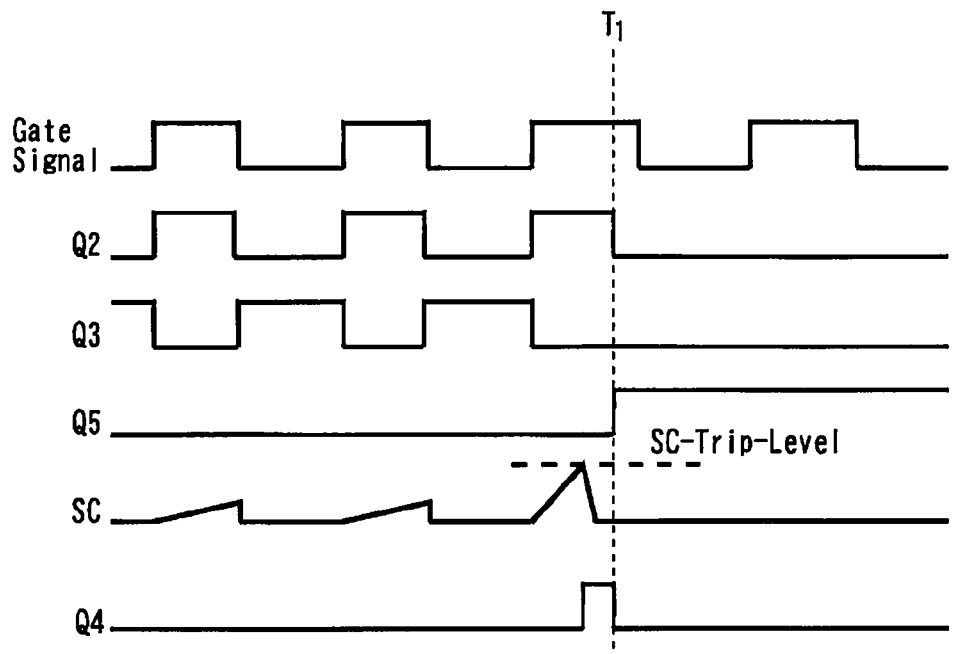
FIG. 8 is a timing chart showing the operation of the variation of the gate circuit of the second embodiment.

FIG. 7 is a circuit diagram of a variation of the gate circuit of the second embodiment. This gate circuit differs from that of the second embodiment in that an output of the flip-flop circuit 22 is connected to the gate of the second switching device Q5. FIG. 8 is a timing chart showing the operation of each switching device in this gate circuit. The second switching device Q5 is turned on at time T1 (see FIG. 8) when the power device Q1 is to be turned off after an excessive current in the power device Q1 is detected. Thus this gate circuit has the same advantages as the gate circuit of the second embodiment.

The gate circuit of the second embodiment is susceptible of at least alterations which are the same as or correspond to those that can be made to the gate circuit of the first embodiment.

Third Embodiment

FIG. 9 is a circuit diagram of a gate circuit in accordance with a third embodiment of the present invention. In this gate circuit, two resistances are connected in parallel between the power supply V1 and the gate of the power device Q1. Specifically, these resistances are a first gate resistive element R2 and a second gate resistive element R7 having a greater resistance value than the first gate resistive element R2. A first on-switching device Q2 is connected to the first gate resistive element R2. The first on-switching device Q2 is used to permit and prevent the application of a voltage through the first gate resistive element to the gate of the power device Q1. On the other hand, a second on-switching device Q7 is connected to the second gate resistive element R7. The second on-switching device Q7 is used to permit and prevent the application of a voltage through the second gate resistive element R7 to the gate of the power device Q1.

One and of a resistive element R8 is connected to the gate of the power device Q1. The resistance value of the resistive element R8 is equal to that of the second resistive element R7. The other end of the resistive element R8 is connected to one end of a switching device Q4. The other end of the switching device Q4 is connected to ground. One end of the capacitor C1, a resistive element R9, and the cathode of a diode D3 are connected to the gate of the switching device Q4. The anode of the diode D3 is connected to a third terminal OUT3 of a controller integrated circuit 50.

The operation of the gate circuit of the third embodiment will now be described. FIG. 10 is a timing chart showing the signal level at each terminal, etc. of the controller integrated circuit 50 of the third embodiment. First, the normal operation of the gate circuit will be described with reference to the period from time T1 until time T3 in FIG. 10. In FIG. 10, T1 indicates a time at which the power device Q1 is turned on, and T3 indicates a time at which the power device Q1 is turned off. Further, T2 indicates a time between time T1 and time T3 (that is, at time T2 the power device Q1 is on). When turning on the power device Q1 at T1, signals for turning on the first on-switching device Q2 and the second on-switching device Q7 are supplied from a first terminal OUT1 and a fourth terminal OUT4, respectively, of the controller integrated circuit 50 to the gates of the respective on-switching devices. These signals turn on the first and second on-switching devices Q2 and Q7, and as a result a voltage is applied from the power supply V1 through the parallel-connected first and second gate resistive elements R2 and R7 to the gate of the power device Q1. Thus, the controller integrated circuit 50 functions to turn on the first on-switching device Q2 and the second on-switching device Q7 to turn on the power device Q1.

At time T2, some time after the power device Q1 is turned on, the controller integrated circuit 50 cuts off the signal supply to the first terminal OUT1 so as to turn off the first on-switching device Q2. That is, when the power device is in its steady on state, the controller integrated circuit 50 functions so that the first on-switching device Q2 is off and the second on-switching device Q7 is on. In this steady state of the power device Q1, the gate voltage is applied to the gate only through the second gate resistive element R7. When turning off the power device Q1 at time T3, the off-switching device Q3 is turned on so that the gate resistive element R3 is electrically connected between the gate of the power device Q1 and ground.

The operation of the gate circuit when the current in the power device Q1 has reached a predetermined value will now be described with reference to the period from time T4 until time T5 in FIG. 10. When the power device Q1 is in its on state, it may happen that an excessive current flows through the power device Q1 due to arm short-circuit, etc. When an excessive current flows in the power device Q1, the capacitor C1 is charged. When the current in the power device Q1 reaches a predetermined value, the switching device Q4 is turned on by the charged voltage on the capacitor C1. As a result, part of the gate supply voltage from the power supply V1 appears across the resistive element R8 (that is, the gate supply voltage is applied across the series connection of the second gate resistive element R7 and the resistive element R8), resulting in a reduced voltage being applied to the gate of the power device Q1. Since the resistance value of the resistive element R8 is equal to that of the second gate resistive element R7, the voltage across the resistive element R8 is half the gate supply voltage. It should be noted that when the power device Q1 is in its on state, its gate voltage is normally substantially equal to the gate supply voltage from the power supply V1.

The switching device Q4 is on during the period between time T4 and time T5. The reason for this is that the gate circuit includes the capacitor C1 serving as an excessive current suppression means for turning on the switching device Q4 just when the current in the power device reaches a predetermined value. During the period between time T4 and time T5, no signal for turning on the switching device Q4 is output from the third terminal OUT3.

At time T5, some time after the switching device Q4 is turned on, the controller integrated circuit 50 detects an excessive current flowing in the power device by sensing the voltage on the SC terminal and supplies a signal for maintaining the switching device Q4 in its on state and at the same time cuts off the signal supply to the second on-switching device Q7. As a result, the power device Q1 is gradually turned off by use of the resistive element R8, which is connected between the gate of the power device Q1 and ground. Thus, in this case the controller integrated circuit 50 acts as a turn-off delay means.

The gate circuit of the third embodiment turns on the power device Q1 by applying a voltage to its gate through two parallel connected resistances (i.e., the first gate resistive element R2 and the second gate resistive element R7), resulting in reduced turn-on loss. Further, when the current in the power device Q1 reaches a predetermined value, the switching device Q4 is turned on, resulting in rapid reduction of the excessive current in the power device Q1.

It should be noted that the resistance value of the second gate resistive element R7 is selected to be higher than that of the first gate resistive element R2. Therefore, the resistance value of the resistive element R8, which is selected be equal to the resistance value of the second gate resistive element R7, can be relatively high. As a result, after reducing the excessive current in the power device Q1, the power device Q1 can be gradually turned off by use of the resistive element R8 having a relatively high resistance value. This means that it is possible to turn off the power device Q1 while maintaining a slow rate of decrease in the current (di/dt) in the device.

The gate circuit of the third embodiment is susceptible of at least alterations which are the same as or correspond to those that can be made to the gate circuit of the first embodiment. For example, the excessive current suppression means (i.e., the capacitor C1) for turning on the switching device Q4 may be charged by a current from a current sensor connected to the power device Q1. Further, the switching device Q4 may be a bipolar transistor.

Fourth Embodiment

Figure 11:
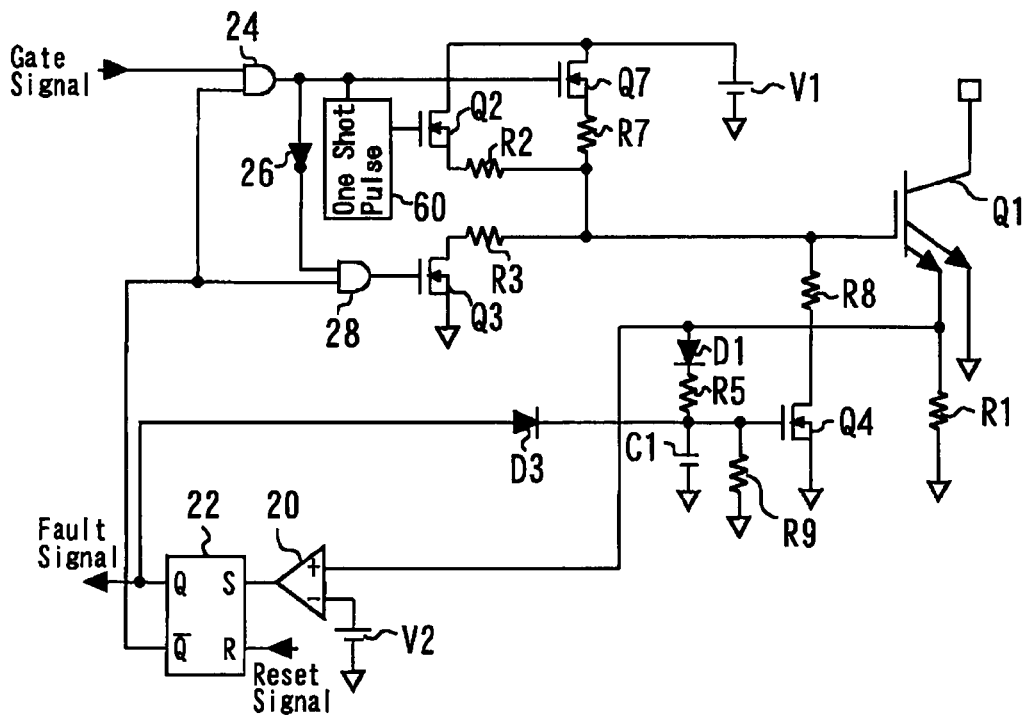
FIG. 11 is a circuit diagram of a gate circuit in accordance with a fourth embodiment of the present invention.

FIG. 11 is a circuit diagram of a gate circuit in accordance with a fourth embodiment of the present invention. The turn-off delay means for turning off the power device Q1 in accordance with the fourth embodiment is formed by discrete components. That is, this gate circuit differs from that of the third embodiment in that the controller integrated circuit 50 is replaced by discrete components. It should be noted that a gate circuit which includes discrete components in place of a controller integrated circuit was described above in connection with the second embodiment and with reference to FIG. 6. The following description of discrete components of the gate circuit of the fourth embodiment will be primarily directed to the differences from the discrete components shown in FIG. 6.

Referring to FIG. 11, an output of the flip-flop circuit 22 is connected to the anode of a diode D3. The flip-flop circuit 22 supplies an on signal to the gate of the switching device Q4 so that the switching device Q4 remains in its on state even after the charge accumulated on the capacitor C1 has been discharged through the resistive element R9.

Figure 12:
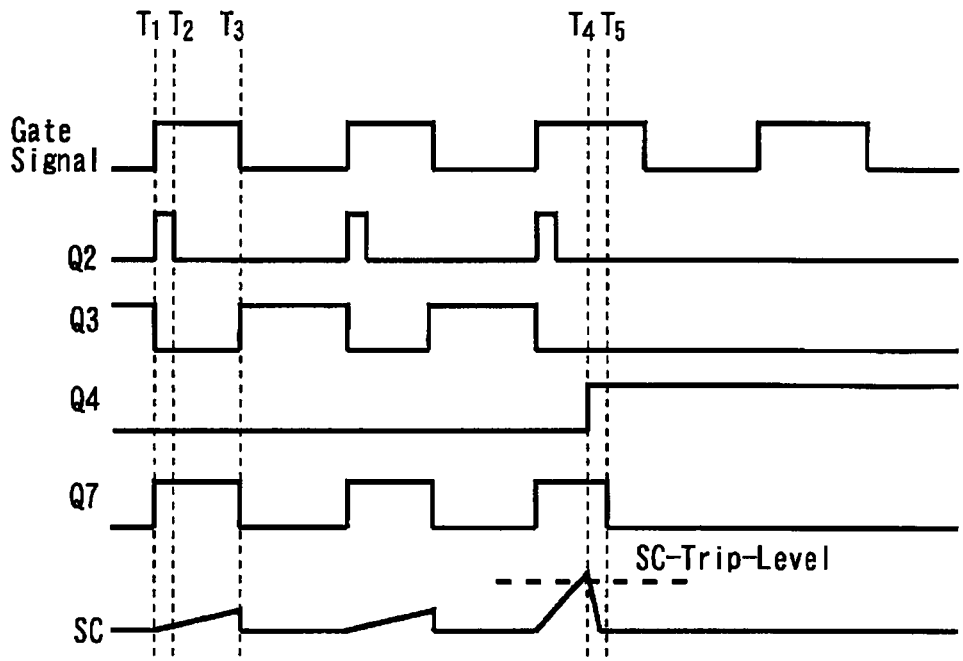
FIG. 12 is a timing chart showing the operation of the gate circuit of the fourth embodiment.

The gate circuit of the fourth embodiment includes a one-shot pulse circuit 60. The one-shot pulse circuit 60 is used for the on-off control of the first on-switching device Q2. FIG. 12 is a timing chart showing the operation of the gate circuit of the fourth embodiment. This timing chart is substantially similar to that shown in FIG. 10, except that the switching device Q4 is turned on only when the power device Q1 is to be turned off after an excessive current in the power device Q1 is detected.

Figure 13:
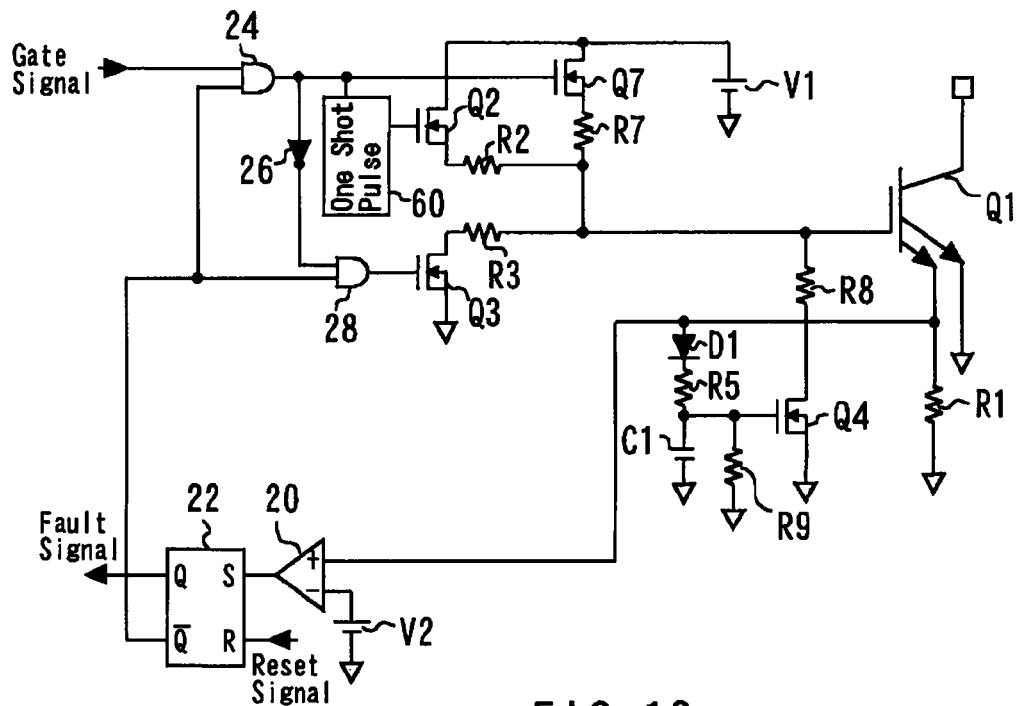
FIG. 13 is a circuit diagram of a variation of the gate circuit of the fourth embodiment.

FIG. 13 is a circuit diagram of a variation of the gate circuit of the fourth embodiment. The gate circuit shown in FIG. 13 differs from that of the fourth embodiment shown in FIG. 11 in that the diode D3 is omitted and the resistive element R9 has a higher resistance value to increase the discharge time constant of the capacitor C1. In this way, the on duration of the switching device Q4 can be extended, eliminating the need for the flip-flop circuit 22 to supply a signal for maintaining the switching device Q4 in its on state.

It should be noted that the gate circuit of the fourth embodiment is susceptible of at least alterations which are the same as or correspond to those that can be made to the gate circuit of the first embodiment.

Fifth Embodiment

Figure 14:
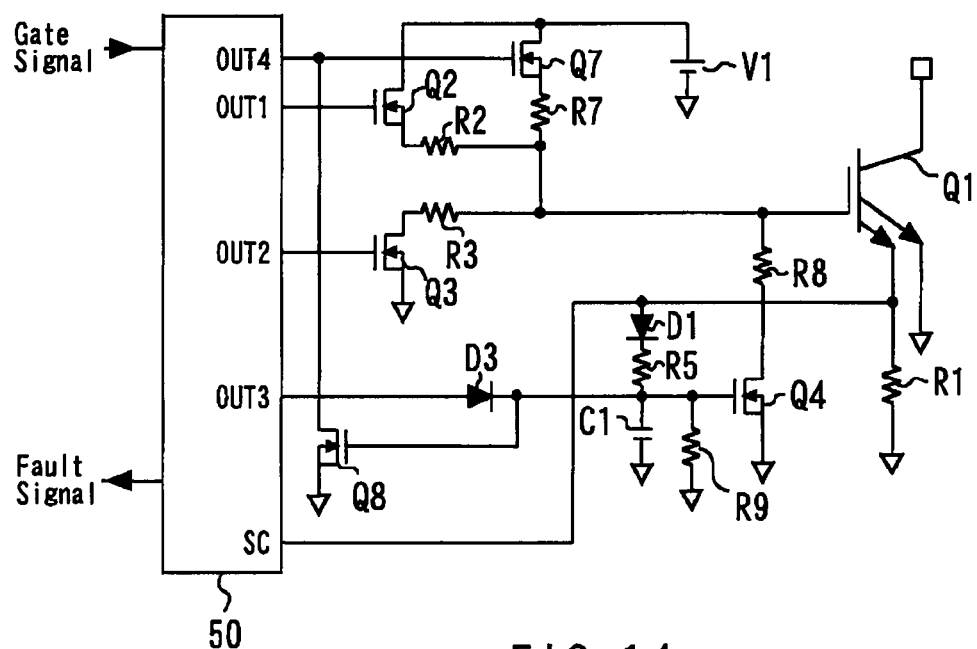
FIG. 14 is a circuit diagram of a gate circuit in accordance with a fifth embodiment of the present invention.

FIG. 14 is a circuit diagram of a gate circuit in accordance with a fifth embodiment of the present invention. The gate circuit of the fifth embodiment differs from that of the third embodiment in that it includes a switching device Q8. The drain of the switching device Q8 is connected between the fourth terminal OUT4 and the gate of the second on-switching device Q7. The source of the switching device Q8 is grounded. The gate of the switching device Q8 is connected to the cathode of the diode D3 and controlled by the output from the third terminal OUT3.

Due to internal processing of the controller integrated circuit 50, it may happen that the gate circuit cuts off the signal supply to the fourth terminal OUT4 and thereby turns off the second on-switching device Q7 only some time after a signal for maintaining the switching device Q4 in its on state is output from the third terminal OUT3. That is, the cutoff of the signal supply to the fourth terminal OUT4 may be delayed with respect to the signal output from the third terminal OUT3. In this case, it is not possible to quickly turn off the second on-switching device Q7 and thereby turn off the power device Q1.

The gate circuit of the fifth embodiment solves this problem. Specifically, when an excessive current flows in the power device Q1, the second on-switching device Q7 is turned off in response to the signal output from the third terminal OUT3 before the signal supply to the fourth terminal OUT4 is cut off. That is, in the event of an excessive current flowing through the power device Q1, a signal for maintaining the switching device Q4 in its on state is output from the third terminal OUT3 and applied to the gate of the switching device Q8 to turn on the switching device Q8 and thereby turn off the second on-switching device Q7. Thus, by receiving from the controller integrated circuit 50 the signal for maintaining the switching device Q4 in its on state, the switching device Q8 functions as a high speed turn-off means for turning off the second on-switching device Q7. In this way, the second on-switching device Q7 can be quickly turned off by the switching device Q8.

FIG. 15 is a circuit diagram of a variation of the gate circuit of the fifth embodiment. The gate circuit shown in FIG. 15 differs from that of the fifth embodiment shown in FIG. 14 in that the diode D3 is omitted and the resistive element R9 has a higher resistance value to increase the discharge time constant of the capacitor C1. In this way, the on duration of the switching device Q4 can be extended, eliminating the need for the controller integrated circuit 50 to supply a signal for maintaining the switching device Q4 in its on state. In addition to this, the gate circuit of the fifth embodiment is susceptible of at least alterations which are the same as or correspond to those that can be made to the gate circuit of the first embodiment.

In accordance with the present invention, when an excessive current flows through a power device, part of the gate supply voltage appears across a resistive element connected to the gate of the device so as to reduce the gate voltage and thereby quickly reduce the excessive current. Further, after reducing the excessive current in the power device, the power device is turned off by use of a resistive element of a relatively high resistance value connected to its gate, making it possible to turn off the power device while maintaining a slow rate of decrease in the current (di/dt) in the device.

Obviously many modifications and variations of the present invention are possible in the light of the above teachings. It is therefore to be understood that within the scope of the appended claims the invention may be practiced otherwise than as specifically described.

The entire disclosure of a Japanese Patent Application No. 2011-051502, filed on Mar. 9, 2011 including specification, claims, drawings and summary, on which the Convention priority of the present application is based, are incorporated herein by reference in its entirety.

What is claimed is:

1. A gate circuit comprising:
a gate resistive element connected at one end to the gate of a power device;
an on-switching device connected between a power supply and the other end of said gate resistive element;
a first resistive element connected at one end to said gate;
a first switching device connected at one end to the other end of said first resistive element and at the other end to ground;
a second resistive element connected at one end to said gate and having a higher resistance value than said first resistive element;
a second switching device connected at one end to the other end of said second resistive element and at the other end to ground;
excessive current suppression means for turning on said first switching device just when the current in said power device reaches a predetermined value; and
turn-off delay means for, after said excessive current suppression means turns on said first switching device, turning off said on-switching device and said first switching device and turning on said second switching device to turn off said power device.

2. The gate circuit according to claim 1, wherein said excessive current suppression means includes a capacitor adapted so that said first switching device is turned on by the charged voltage on said capacitor just when said current in said power device reaches said predetermined value.

3. The gate circuit according to claim 2, wherein said capacitor is charged by either an emitter sense current from said power device or a current from a current sensor externally connected to said power device.

4. The gate circuit according to claim 1, wherein said turn-off delay means is formed by a controller integrated circuit which initiates internal processing after said current in said power device reaches said predetermined value.

5. The gate circuit according to claim 1, wherein said turn-off delay means is formed by discrete components.

6. A gate circuit comprising:
the parallel connection of a first gate resistive element and a second gate resistive element connected between a power supply and the gate of a power device, said second gate resistive element having a higher resistance value than said first gate resistive element;
a first on-switching device for permitting and preventing the application of a voltage through said first gate resistive element to said gate;
a second on-switching device for permitting and preventing the application of a voltage through said second gate resistive element to said gate;
a resistive element connected at one end to said gate;
a switching device connected at one end to the other end of said resistive element and at the other end to ground;
means for turning on said first on-switching device and said second on-switching device to turn on said power device;
means for, when said power device is maintained in a steady on state, turning off said first on-switching device and maintaining said second on-switching device in an on state;
excessive current suppression means for turning on said switching device just when the current in said power device reaches a predetermined value; and
turn-off delay means for, after said excessive current suppression means turns on said switching device, turning off said second on-switching device and maintaining said switching device in an on state to turn off said power device.

7. The gate circuit according to claim 6, wherein said excessive current suppression means includes a capacitor adapted so that said switching device is turned on by the charged voltage on said capacitor just when said current in said power device reaches said predetermined value.

8. The gate circuit according to claim 6, wherein:
said turn-off delay means is formed by a controller integrated circuit; and
said gate circuit further comprises high speed turn-off means for turning off said second on-switching device by use of a signal for maintaining said switching device in said on state, said signal being output from said controller integrated circuit.

9. A gate circuit comprising:
a gate resistive element connected at one end to the gate of a power device;
an on-switching device connected between a power supply and the other end of said gate resistive element;
a first resistive element connected at one end to said gate;
a first switching device connected at one end to the other end of said first resistive element and at the other end to ground;
a second resistive element connected at one end to said gate and having a higher resistance value than said first resistive element;
a second switching device connected at one end to the other end of said second resistive element and at the other end to ground;
an excessive current suppressor for turning on said first switching device just when the current in said power device reaches a predetermined value; and
a controller integrated circuit for, after said excessive current suppressor turns on said first switching device, turning off said on-switching device and said first switching device and turning on said second switching device to turn off said power device.

10. A gate circuit comprising:
the parallel connection of a first gate resistive element and a second gate resistive element connected between a power supply and the gate of a power device, said second gate resistive element having a higher resistance value than said first gate resistive element;
a first on-switching device for permitting and preventing the application of a voltage through said first gate resistive element to said gate;
a second on-switching device for permitting and preventing the application of a voltage through said second gate resistive element to said gate;
a resistive element connected at one end to said gate;
a switching device connected at one end to the other end of said resistive element and at the other end to ground;
a turn on portion for turning on said first on-switching device and said second on-switching device to turn on said power device;
a turn off portion for, when said power device is maintained in a steady on state, turning off said first on-switching device and maintaining said second on-switching device in an on state;
an excessive current suppressor for turning on said switching device just when the current in said power device reaches a predetermined value; and
a controller integrated circuit for, after said excessive current suppressor turns on said switching device, turning off said second on-switching device and maintaining said switching device in an on state to turn off said power device.

* * * * *